United States Patent [19]

Nakano

[11] Patent Number: 5,777,021

[45] Date of Patent: *Jul. 7, 1998

[54] COMPOSITION OF STYRENE POLYMER AND POLAR GROUP-CONTAINING POLYPHENYLENE ETHER

[75] Inventor: Akikazu Nakano, Osaka, Japan

[73] Assignee: Idemitsu Kosan Co., Ltd., Tokyo, Japan

[*] Notice: The term of this patent shall not extend beyond the expiration date of Pat. Nos. 5,165,990; 5,326,813 and 5,391,611.

[21] Appl. No.: 941,322

[22] Filed: Sep. 30, 1997

Related U.S. Application Data

[63] Continuation of Ser. No. 662,507, Jun. 13, 1996, abandoned, which is a continuation of Ser. No. 424,232, Apr. 19, 1995, abandoned, which is a continuation of Ser. No. 340,818, Nov. 17, 1994, abandoned, which is a continuation of Ser. No. 15,306, Feb. 9, 1993, abandoned, which is a continuation of Ser. No. 581,115, Sep. 12, 1990, abandoned.

[30] Foreign Application Priority Data

Oct. 13, 1989 [JP] Japan .................. 1-264996
Oct. 13, 1989 [JP] Japan .................. 1-264997

[51] Int. Cl.$^6$ .................. C08K 3/22; C08K 7/14; C08L 25/06; C08L 25/08
[52] U.S. Cl. .................. 524/508; 524/437; 524/451; 525/132
[58] Field of Search .................. 525/132, 397; 524/508, 437, 451

[56] References Cited

U.S. PATENT DOCUMENTS

| | | | |
|---|---|---|---|
| 3,708,455 | 1/1973 | Nakanishi et al. | 524/521 |
| 4,745,157 | 5/1988 | Yates, III et al. | 525/133 |
| 4,806,602 | 2/1989 | White et al. | 528/212 |
| 4,892,900 | 1/1990 | Sasaki et al. | 525/133 |
| 4,894,415 | 1/1990 | Sasaki et al. | 525/479 |
| 4,937,272 | 6/1990 | Sumitomo | 521/59 |
| 4,946,897 | 8/1990 | Albizatti et al. | 525/132 |
| 5,034,441 | 7/1991 | Nakano et al. | 524/577 |
| 5,086,105 | 2/1992 | Abe et al. | 525/132 |
| 5,109,068 | 4/1992 | Yamasaki et al. | 525/132 |
| 5,145,950 | 9/1992 | Funaki et al. | 528/481 |
| 5,164,479 | 11/1992 | Funaki et al. | 525/241 |
| 5,165,990 | 11/1992 | Nakano | 525/132 |
| 5,166,238 | 11/1992 | Nakano et al. | 524/120 |
| 5,183,853 | 2/1993 | Guerra et al. | 525/132 |
| 5,183,871 | 2/1993 | Yamasaki et al. | 525/241 |
| 5,326,813 | 7/1994 | Okada et al. | 525/133 |
| 5,391,603 | 2/1995 | Wessel et al. | 525/68 |
| 5,391,611 | 2/1995 | Funayama et al. | 525/68 |

FOREIGN PATENT DOCUMENTS

| | | |
|---|---|---|
| 0 226 910 | 7/1987 | European Pat. Off. . |
| 0 314 146 | 5/1989 | European Pat. Off. . |

OTHER PUBLICATIONS

Chemical Abstracts, vol. 111, No. 12, Sep. 18, 1989, p. 74, Abstract No. 98736c, "Glass fiber-reinforced poly(phenylene ether) compositions", N. Yamamoto et al.

Chemical Abstracts, vol. 109, No. 16, Oct. 1988, p. 44, abstract No. 130300c, "Solvent-and impact-resistant polyoxyphenylene-polyamide compositions with good dimensional stability", S. Shibuya.

Primary Examiner—Robert E. Sellers
Attorney, Agent, or Firm—Frishauf, Holtz, Goodman, Langer & Chick, P.C.

[57] ABSTRACT

Disclosed is a styrene polymer composition comprising, in a specified proportion, (A) a styrene polymer having no functional group, and (B) either of polyphenylene ether having a polar group or a mixture of polyphenylene ether having a polar group and a styrene polymer having no functional group; or a styrene polymer composition comprising (C) polyamide, as well as above Components (A) and (B).

These polymer compositions are excellent in impact resistance, water resistance, and mechanical properties, and are suitable for various purposes.

19 Claims, No Drawings

COMPOSITION OF STYRENE POLYMER AND POLAR GROUP-CONTAINING POLYPHENYLENE ETHER

This application is a Continuation of application Ser. No. 08/662,507, filed Jun. 13, 1996 abandoned; which is a Continuation of application Ser. No. 08/424,232, filed Apr. 19, 1995 (abandoned); which is a Continuation of application Ser. No. 08/340,818, filed Nov. 17, 1994 (abandoned); which is a Continuation of application Ser. No. 08/015,306, filed Feb. 9, 1993 (abandoned); which is a Continuation of application Ser. No. 07/581,115, filed Sep. 12, 1990 (abandoned).

BACKGROUND OF THE INVENTION

1. Field of the Invention

The present invention relates to a styrene polymer composition. More particularly, it is concerned with a styrene polymer composition which is suitable to be molded into industrial materials such as electric and electronic materials (e.g., connector, and printed substrates), construction materials for industrial use, parts of automobiles (e.g., connectors for the use on vehicles, wheel caps, cylinder head cover, etc.), parts of home electric appliances, and various machines.

2. Description of the Related Arts

Heretofore, synthetic resins have been improved in their mechanical properties, particularly, rigidity and heat resistance, by compounding inorganic fillers including glass fiber with them. Styrene polymers, however, have not a sufficient adhesivity to inorganic fillers so that additives to improve their adhesivity and surface-treating agents of inorganic fillers have been studies. As the result, various surface-treating agents which contain various kinds of aminosilane compounds with polyester type resins, urethane type resins, epoxy type resins, acrylic type resins, or vinyl acetate type resins, and also additives such as maleic anhydride/styrene copolymers and the like have been developed. Specifically, surface-treating agents such as silane-based coupling agents for glass fibers and the like, and a composition containing an additive, such as a styrene/maleic anhydride-styrene/glass fiber composition (Japanese Patent Application Laid-Open No. 161836/1980, Japanese Patent Application Laid-Open No. 19097/1970) have been known. However, these had not sufficiently improved effects yet.

Japanese patent Application Laid-Open No. 257948/1987 and others proposed resin compositions which were excellent in heat resistance and mechanical properties, and which were obtained by adding an inorganic filler to a styrene polymer having a syndiotactic configuration, or adding a thermoplastic resin and/or a rubber and an inorganic filler to a styrene polymer having a syndiotactic configuration. Also in these compositions, however, the adhesivity between the styrene polymer having a syndiotactic configuration and the inorganic filler was insufficient, and had room for improvement.

To be more specifically, when the conventional inorganic fillers surface-treated with various surface-treating agents, and additives were added to the styrene polymer, the adhesivity with styrene polymer, especially a polystyrene having a syndiotactic configuration was insufficient, and the resulting compositions were poor in impact resistance, and none of them had a Izod impact strength (notched) of more than 6.0 kg cm/cm. Accordingly, a styrene polymer composition having an improved impact resistance has been desired.

On the other hand, polyamides have been used as the material to be molded into various products such as domestic products, electric products and parts of machines or devices, since they are excellent in moldability and heat-resistance, and have a sufficient rigidity.

In spite of these excellent properties, however, polyamide has a disadvantage in that it is far from being sufficient in water resistance.

The group of the present inventor has attempted to remove the above disadvantage by blending, with polyamide, a styrene polymer having a high degree of syndiotacticity, but the effect of improving the properties by blending met a limitation, for the composition of such resins as polyamide and polystyrene that are substantially incompatible with each other could not avoid a fall in mechanical properties due to the insufficient strength at the interface between the phases.

Under the circumstances, the present inventor has repeated earnest studies to develop a styrene polymer composition excellent in all of impact resistance, heat resistance, and mechanical strength which has never seen before. Further, the study has proceeded, also in order to develop a composition greatly improved in heat resistance and water resistance, without lowering the mechanical properties of polyamide, by improving the compatibility between a styrene polymer having a syndiotactic configuration and a polyamide resin.

SUMMARY OF THE INVENTION

The present invention provides a styrene polymer composition (Composition I) comprising (A) 99.9 to 20% by weight of a styrene polymer having no functional group, and (B) 0.1 to 80% by weight of polyphenylene ether having a polar group or a mixture of polyphenylene ether having a polar group and a styrene polymer having no functional group.

The present invention also provides a styrene polymer composition (Composition II) comprising (A) 99 to 1% by weight of a styrene polymer having no functional group, (B) 0.1 to 50% by weight of polyphenylene ether having a polar group or a mixture of polyphenylene ether having a polar group and a styrene polymer having no functional group, and (C) 0.9 to 98.9% by weight of polyamide.

DESCRIPTION OF THE PREFERRED EMBODIMENTS

In Composition I and II of the present invention, the styrene polymer having no functional group, used as Component (A), may be various styrene polymers provided that they have no functional group, and those which have at least 25% by weight of the repeating unit, derived from the vinyl aromatic compound represented by the general formula:

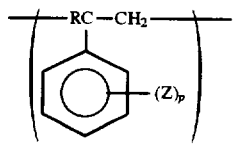

(wherein R is a hydrogen or an alkyl group having 1 to 4 carbon atoms, Z is a hydrogen, a halogen atom, or an alkyl group having 1 to 4 carbon atoms, and p is an integer of 1 to 5) can be used.

Examples of such styrene polymers are homopolymer of styrene or its derivatives; styrene polymer modified by natural or synthetic elastomer material such as polybutadiene, polyisoprene, isobutylene-isoprene rubber, EPDM, ethylene-propylene copolymer, natural rubber, epichlorohydrin; further, styrene-containing copolymers including styrene-methylstyrene copolymer, styrene-butadiene copolymer and the like. Among them, particularly preferred are styrene polymers having a syndiotactic configuration, atactic polystyrene, isotactic polystyrene, poly(α-methyl styrene), polybutadiene-modified styrene polymer, butadiene-styrene copolymer, isoprene-styrene copolymer, and high impact resistant polystyrene (HIPS).

Here, in the styrene polymer having a syndiotactic configuration, the syndiotactic configuration means that the stereostructure is a syndiotactic configuration, i.e., the stereostructure in which phenyl groups or substituted phenyl groups are located as side chains alternately in opposite directions relative to the main chain consisting of carbon—carbon bonds. The tacticity is quantitatively determined by the nuclear magnetic resonance method using a carbon isotope ($^{13}$C-NMR) methods. The tacticity as determined by the $^{13}$C-NMR method can be indicated in terms of proportions of structural units continuously connected to each other, i.e., a diad in which two structural units are connected to each other, a triad in which three structural units are connected to each other, or pentad in which five structural units are connected to each other. Styrene polymers having the syndiotactic configuration of the present invention include polystyrene, poly(alkylstyrene), poly(halogenated styrene), poly(halogenated alkylstyrene), poly(vinyl benzoate), the hydrogenated polymers thereof and the mixtures thereof, and copolymers containing the above polymers as main components, having such a syndiotacticity that the proportion of racemic diad is at least 75%, preferably at least 85%, or the proportion of racemic pentad is at least 30%, preferably at least 50%. The poly(alkylstyrene) can include poly(methylstyrene), poly(ethylstyrene), poly(isopropylstyrene), poly(tert-butylstyrene), poly(phenylstyrene), poly(vinylnaphthalene), and poly(vinylstyrene), etc; the poly(halogenated styrene) include poly(chlorostyrene) poly(bromostyrene), poly(fluorostyrene), etc.

The most preferred styrene polymers are polystyrene, poly(p-methylstyrene), poly(m-methylstyrene), poly(p-tert-butylstyrene), poly(p-chlorostyrene), poly(m-chlorostyrene), poly(p-fluorostyrene), hydrogenated polystyrene, and a copolymer containing the structure units thereof.

The molecular weight of the styrene polymer used in the present invention is not critical, but is preferably at least 10,000, and more preferably at least 50,000 of a weight average molecular weight. If the weight average molecular weight is less than 10,000, the thermal properties and mechanical properties of the resulting composition or the molding is undesirably lowered.

The styrene polymers having a syndiotactic configuration can be produced by polymerizing styrene monomers (corresponding to the above styrene polymers) using a catalyst comprising a titanium compound and a condensate of water and a trialkylaluminum in, for example, an inert hydrocarbon solvent, or in the absence of a solvent (Japanese Patent Application Laid-Open No. 187708/1987).

As Component (B) in Compositions I and II of the present invention, either of a polyphenylene ether having a polar group or a mixture of a polyphenylene ether having a polar group and a styrene polymer having no functional group, is used. An example of styrene polymer having no functional group is, as well as styrene polymers shown as Component (A) above, a styrene polymer obtained by introducing at least one of the compounds including acrylonitrile, methylmethacrylate, methacrylonitrile and the like to a styrene polymer shown as Component (A). The amount of the styrene polymer to be blended with polyphenylene ether is preferably not more than 80% by weight, and if it is in excess of said amount, the substantial amount of polyphenylene ether to the above-mentioned Component (A) is undesirably lowered.

Polyphenylene ether is known in itself. It is described in the specifications of U.S. Pat. Nos. 3,306,874, 3,306,875, 3,257,357, and 3,257,358. Polyphenylene ether can be prepared usually by oxidization coupling reaction in which homopolymer or copolymer is produced in the presence of a copper amine complex and one or more of phenols substituted at two or three positions. Therein copper amine complexes derived from primary, secondary or tertiary amines can be used.

Examples of preferred polyphenylene ethers are
poly(2,3-dimethyl-6-ethylphenylene-1,4-ether),
poly(2-methyl-6-chloromethyl-1,4-phenylene)ether,
poly(2-methyl-6-hydroxydiethyl-1,4-phenylene)ether,
poly(2-methyl-6-n-butyl1,4-phenylene)ether,
poly(2-ethyl-6-isopropyl-1,4-phenylene)ether,
poly(2-ethyl-6-n-propyl-1,4-phenylene)ether,
poly(2,3,6-trimethylphenylene-1,4-ether),
poly|2-(4'-methylphenyl)phenylene-1,4-ether|,
poly(2-bromo-6-phenylphenylene-1,4-ether),
poly(2-methyl-6-phenylphenylene-1,4-ether),
poly(2-phenylphenylene-1,4-ether),
poly(2-chlorophenylene-1,4-ether),
poly(2-methylphenylene-1,4-ether),
poly(2-chloro-6-ethylphenylene-1,4-ether),
poly(2-chloro-6-bromophenylene-1,4-ether),
poly(2-6-di-n-propylphenylene-1,4-ether),
poly(2-methyl-6-isopropylphenylene-1,4-ether),
poly(2-chloro-6-methylphenylene-1,4-ether),
poly(2-methyl-6-ethylphenylene-1,4-ether),
poly(2,6-dibromophenylene-1,4-ether),
poly(2,6-dichlorophenylene-1,4-ether),
poly(2,6-diethylphenylene-1,4-ether), and
poly(2,6-dimethylphenylene-1,4-ether).

Also copolymers derived from two or more of phenyl compounds as used for the preparation of above-mentioned homopolymer are suitable. Further examples are graft copolymers and block copolymers of vinyl aromatic compounds including polystyrene and the above-mentioned polyphenylene ether.

The polar groups contained in Component (B) include acid halide, a carbonyl group, acid anhydride, acid amide carboxylate, acid azide, a sulfone group, a nitrile group, a cyano group, an isocyanic acid ester group, an amino group a hydroxyl group, an imide group, a thiol group, an oxazoline group, and an epoxy group.

Particularly preferable polar group is acid anhydrides among which maleic anhydride is more preferable. The content of said polar group is preferably not less than 0.01% by weight of above polyphenylene ether, and if it is under 0.01% by weight, mechanical strength of resulting polymer cannot be expected to be improved.

In order to obtain said Component (B), a method to polymerize one or plural kinds of phenol compounds having these polar groups, a method to copolymerize one or plural kinds of phenol compounds having a polar group with phenol compounds having no polar group, and a method to react a compound containing both a polar group and an unsaturated group with polyphenylene ether can be used.

Above-mentioned compounds containing both a polar group and an unsaturated group are those which contain, in a molecular, both of an unsaturated group having carbon—carbon double bond or carbon—carbon triple bond; and a polar group such as carboxylic acid group, a group derived from carboxylic acid (for example, various salts, esters, acid amides, acid anhydrides, imides, acid azides, and acid halides which result from substitution of hydrogen atoms or a hydroxyl group of carboxyl group), or oxazoline, nitrile, epoxy group, amino group, hydroxylic acid or isocyanate.

As the compound containing both of an unsaturated group and a polar group, unsaturated carboxylic acid, unsaturated carboxylic acid derivative, unsaturated epoxy compound, unsaturated alcohol, unsaturated amine, unsaturated isocyanate and the like are mainly used.

Specific examples of these compounds are maleic anhydride, maleic acid, fumaric acid, maleimide, maleic hydrazide, reaction products of maleic anhydride and diamine such as the compounds having the structure represented by:

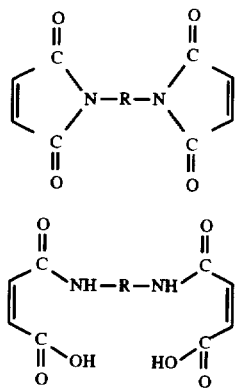

(wherein R is an aliphatic group, or an aromatic group); anhydrous methyl, methyl nadic anhydride, dichloromaleic anhydride, maleic acid amide, itaconic acid, itaconic anhydride, acids of natural fats and oils such as soybean oil, tung oil, castor oil, linseed oil, hempseed oil, cotton seed oil, sesame oil, rapeseed oil, peanut oil, camellia oil, olive oil, coconut oil, and sardine oil; unsaturated carboxylic acids such as acrylic acid, butenoic acid, crotonic acid, vinyl acetic acid, methacrylic acid, pentenoic acid, angelic acid, 2-pentenoic acid, 3-pentenoic acid, α-ethylacrylic acid, β-methylcrotonic acid, 4-pentenoic acid, 2-hexenoic acid, 2-methyl-2-pentenoic acid, 3-methyl-2-pentenoic acid, α-ethylcrotonic acid, 2-2-dimethyl-3-butenoic acid, 2-heptenoic acid, 2-octenoic acid, 4-decenoic acid, 9-undecenoic acid, 10-undecenoic acid, 4-dodecenoic acid, 5-dodecenoic acid, 4-tetradecenoic acid, 9-tetradecenoic acid, 9-hexadecenoic acid, 2-octadecenoic acid, 9-octadecenoic acid, eicosenoic acid, dococenoic acid, erucic acid, tetracosenoic acid, 2,4-pentadienoic acid, 2,4-hexadienoic acid, diallyl acetate, geraniumic acid, 2,4-decadienoic acid, 2,4-dodecadienoic acid, 9,12-hexadecanienoic acid, 9,12-octadecadienoic acid, hexadecatrienoic acid, linolic acid, linolenic acid, octadecatrienoic acid, eicosadienoic acid, eicosatrienoic acid, eicosatetraenoic acid, ricinolic acid, eleostearic acid, oleic acid, eicosapentaenoic acid, docosadienoic acid, docosatrienoic acid, docosatetraenoic acid, docosapentaenoic acid, tetracosenoic acid, hexacosenoic acid, hexacodienoic acid, octacosenoic acid, and esters, acid amides and anhydrides of these unsaturated carboxylic acids; unsaturated alcohols such as allyl alcohol, methylvinyl carbinol, allyl carbinol, methylpropenyl carbinol, 4-pentene-1-ol, 10-undecane-1-ol, propargyl alcohol, 1,4-pentadiene-3-ol, 1,4-hexadiene-3-ol, 3,5-hexadiene-2-ol, 2,4-hexadiene-1-ol, alcohols represented by the general formulas: $C_nH_{2n-5}OH$, $C_nH_{2n-7}OH$, $C_nH_{2n-9}OH$ (n is a positive integer), 3-butene-1,2-diol, 2,5-dimethyl-3-hexene-2,5-diol, 1,5-hexadiene-3,4-diol, and 2,6-octadiene-4,5-diol, and unsaturated amines which result from substitution of $NH_2$ for OH group of these unsaturated alcohols; those result from addition of maleic anhydride or phenols to low polymers (e.g., polymers having an average molecular weight of 500 to 10000) or high-molecular polymers (e.g., those having an average molecular weight of 10000 or more) of butadiene or isoprene; those compounds to which amino group, carboxyl group, hydroxyl group, or epoxy group is introduced; and allyl isocyanate.

Examples of the vinyl compounds having epoxy group are glycidyl methacrylate, glycidyl acrylate, vinyl glycidyl ether, glycidyl ether of hydroxyalkyl(meth)acrylate, glycidyl ether of polyalkyleneglycol(meth)acrylate, and glycidylitaconate, among which glycidyl methacrylate is particularly preferred.

The compound having both of an unsaturated group and a polar group in the present invention also include, needless to say, compounds having two or more of unsaturated groups and two or more of polar groups (the same or different), and two or more of compounds having such groups.

Specified methods for preparing Component (B) include a method to melt and knead a polyphenylene ether and a compound having both a polar group and an unsaturated group at a temperature of 150° C. to 350° C. by the use of a roller mill, Banbury mixer, an extruder or the like, to react them, and a method to heat and react a polyphenylene ether and a compound having both a polar group and an unsaturated group in the solvent such as benzene, toluene, xylene and the like. Further, in order to proceed with these reactions, it is effective to use a radical initiator, in the reaction system, such as organic peroxides including benzoyl peroxide, di-t-butyl-peroxide, dicumylperoxide, and t-butylperoxibenzoate, or azo compounds including azobisisobutylonitrile, azobisisobaleronitrile and the like.

A method to melt and knead a polyphenylene ether and a compound having both a polar group and an unsaturated group in the presence of radical initiator is more effective.

Component (B) can be produced also by melting and kneading the above-mentioned styrene polymer as a part of Component (B), a polyphenylene ether and a compound having both a polar group and an unsaturated group, in the presence of a radical initiator.

In Composition I of the present invention, the amount of Component (B) is 0.1 to 80% by weight, preferably 0.5 to 50% by weight, particularly preferably 1 to 25% by weight, of the total amount of Component (A) and Component (B). Particularly when styrene polymer having a syndiotactic configuration is used as Component (A), the amount of Component (B) is 0.1 to 50% by weight, preferably 0.5 to 30% by weight, and most preferably 1 to 25% by weight. Polyphenylene ether as Component (B) or as a part of Component (B) has a high compatibility with styrene polymer as Component (A), but if the amount of it is under 0.1% by weight, the resulting composition cannot be improved in mechanical strength.

On the other hand, if it is added in excess of 80% by weight, the final composition becomes very near to Component (B) itself, which is poor in moldability. When a styrene polymer having a syndiotactic configuration is used, a very high compatibility with polyphenylene ether is obtained, but if it is added in excess of 50% by weight, heat resistance and moldability of the resulting composition are sometimes lowered.

In Composition II of the present invention, the amount of Component (A) to be blended is 1 to 99% by weight, preferably 10 to 95% by weight, and more preferably 20 to 95% by weight. Herein if the amount of Component (A) is under 1% by weight, the resulting Composition II cannot be improved in water resistance, while if it is in excess of 99% by weight, the mechanical strength of said composition becomes almost the same as that of the styrene polymer as Component (A).

In Composition II of the present invention, the amount of Component (B) is 0.1 to 50% by weight, preferably 0.5 to 40% by weight, and more preferably 1 to 30% by weight. Particularly, when a styrene polymer having a syndiotactic configuration is used as Component (A), said amount is preferably 0.5 to 30% by weight, and most preferably 1 to 25% by weight. Said polyphenylene ether as Component (B) or a part of it has a high compatibility with a styrene polymer as Component (A), but if its content is under 0.1% by weight, the resulting composition cannot be improved in mechanical strength. If it is added in an amount of above 50% by weight, the resulting composition becomes lowered in heat resistance and moldability.

To produce Compositions I and II of the present invention, it is not necessary to prepare in advance said Component (B), but these compositions can be produced by mixing styrene polymer as Component (A) and a part of Component (B), a polyphenylene ether to be Component (B), a compound having both a polar group and an unsaturated group, and additives such as fillers, and subsequently by melting and kneading the mixture thereof at 150° to 350° C. with the use of a roller mill, a Banbury mixer, an extruder and the like.

Composition I of the present invention basically comprises above Component (A) and Component (B).

On the other hand, in Composition II of the present invention, polyamide is blended further as Component (C). As said polyamide as Component (C), all the conventional thermoplastic polyamide can be used. Examples of preferred polyamides are polyamide-4; polyamide-6; polyamide-4,6; polyamide-6,6; polyamide-3,4; polyamide-12; polyamide-11, polyamide-6,10; polyamide purified from terephthalic acid and 4,4,'-diaminocyclohexylmethane; polyamide purified from azelaic acid, adipic acid and 2,2-bis(p-aminocyclohexyl)-propane; polyamide purified from adipic acid and methaxylylene diamine; and polyamide purified from terephthalic acid and trimethylhexamethylene diamine.

Aromatic polyamide resin (hereinafter referred to as PA) is a polyamide containing an amide bond having an aromatic nucleus, as a repeating unit, in its main chain. More specifically, the aromatic polyamide resin used in the present invention is appropriately selected from the polymers which are obtained by reacting, according to the conventional method, ω'-carboxylic compound having aromatic group with the polymer obtained by reacting an aromatic diamine component and a dicarboxylic acid component.

As the aromatic diamine components, diamine compounds having benzene ring, of which typical examples are 1,4-diaminobenzene; 1,3-diaminobenzene; 1,2-diaminobenzene; 2,4-diaminotoluene; 2,3-diaminotoluene; 2,5-diaminotoluene; 2,6-diaminotoluene; ortho-, meta-, and para-xylilene diamine; ortho-, meta-, and para-2,2'-diaminodiethyl benzene; 4,4'-diaminobiphenyl; 4,4,'-diaminodiphenyl methane; 4,4'-diaminodiphenyl ether; 4,4'-diaminodiphenyl thioether; 4,4'-diaminodiphenyl ketone; and 4,4'-diaminodiphenyl sulfone, are used. The aromatic diamine component may be solely the diamine compound having the above benzene ring, or may be a mixture with other diamine compounds such as aliphatic diamines, as long as said diamine compound is contained in the amount of at least 50 mol %. Of course, two or more kinds of diamine compounds having benzene ring may be used in combination.

Next, examples of dicarboxylic acid components are aliphatic dicarboxylic compounds such as glutaric acid, adipic acid, pimelic acid, suberic acid, azelaic acid, and sebacic acid; aromatic dicarboxylic compounds such as phthalic acid, isophthalic acid, terephthalic acid, naphthalene dicarboxylic acid and the like; and further, acid chlorides of these dicarboxylic compounds. These compounds can be used in combination.

Further, examples of ω-amino-ω'-carboxylic compounds having an aromatic nucleus are 4-aminophenylcarboxyl methane, 1-(4-aminophenyl)-2-carboxyl ethane, 3-(4-aminophenyl)-1 -carboxyl propane, para-(3-amino-3'-hydroxy)dipropyl benzene and the like. Preferred aromatic polyamide resins used in the present invention are polyamides derived from diamine compound having benzene ring and aliphatic dicarboxylic acid, and a more preferable example is a polyamide derived from xylylene diamine and adipic acid.

The most preferable example is a polyamide derived from meta-xylylene diamine and adipic acid.

The amount of said Component (C) blended is 0.9 to 98.9% by weight, preferably 5 to 90% by weight, more preferably 5 to 65% by weight. If the amount of it is under 0.9% by weight, no improvement in mechanical strength results. If it is in excess of 98.9% by weight, the water resistance of the resulting composition becomes very near to that of polyamide.

Composition II of the present invention comprises basically above Components (A), (B) and (C).

In Compositions I and II of the present invention, if necessary, a filler which is surface-treated with a coupling agent can be blended as Component (D). The filler used in the present invention may be in fibrous form, or in the form of granule or powder. Fillers in fibrous forms include glass fiber, carbon fiber, organic synthetic fiber, whisker, ceramic fiber, metal fiber, natural vegetable fiber and the like.

Examples of specified organic synthetic fibers are those including all aromatic polyamide fibers, and polyimide fibers; whiskers of boron, alumina, silica, and silicon carbide; ceramic fibers of gypsum, potassium titanate, magnesium sulfate, and magnesium oxide; metal fibers of copper aluminum, and steel; and particularly preferred are glass fibers and carbon fibers. The shape of fillers vary in cloth mat, bundling cut form, short fiber, filament-form, and whisker. In bundling cut form, the length is preferably 0.0 to 50 mm, and the fiber diameter is preferably 5 to 20 μm. As carbon fiber, fibers of polyacrylonitrile (PAN) are preferred.

On the other hand, the particle or powder fillers include talc, carbon black, graphite, titanium dioxide, silica, mica calcium carbonate, calcium sulfate, barium carbonate, magnesium carbonate, magnesium sulfate, barium sulfate oxysulfate, tin oxide, alumina, kaolin, silicon carbide, metal powder, glass powder, glass flake, glass beads and the like Talc, calcium carbonate, and mica are particularly preferred A preferred average particle diameter of talc is 0.3 to 20 μm more preferably 0.6 to 10 μm. A preferred average particle diameter of calcium carbonate is 0.1 to 20 μm, and preferred average particle diameter of mica is 40 to 250 μm, and most preferably 50 to 150 μm.

In the various fillers as above, particularly preferred are glass fillers such as glass powder, glass flake, glass beads, glass filament, glass fiber, glass roving, and glass mat. The coupling agent used for the surface treatment of above fillers is used for improving the adhesiveness between the filler and polyphenylene ether having a polar group, as Component (B). Therein any one of silane coupling agents and titanium coupling agents, which are conventionally known as coupling agents can be used.

Preferred examples of the silane coupling agents are specifically, triethoxysilane, vinyltris(β-methoxyethoxy) silane, γ-methacryloxypropyltrimethoxysilane, γ-glycidoxypropyltrimethoxysilane, β-(1,1-epoxycyclohexyl)ethyltrimethoxysilane, N-β-(aminoethyl)-γ-aminopropyltrimethoxysilane, N-β-(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, γ-chloropropyltrimethoxysilane, γ-aminopropyltrimethoxysilane, γaminopropyltrimethoxysilane, γ-aminopropyl-tris(2-methoxy-ethoxy)silane, N-methyl-γ-aminopropyltrimethoxysilane, N-vinylbenzyl-γ-aminopropyltriethoxysilane, triaminopropyltrimethoxysilane, 3-ureidopropyltrimethoxysilane, 3-(4,5-dihydroimidazole) propyltriethoxysilane, hexamethyldisilazane, N,O-(bistrimethylsilyl)amide, N,N-bis(trimethylsilyl)urea and the like. Among them, preferred are aminosilanes and epoxysilanes such as γ-aminopropyltriethoxysilane, N-β-(aminoethyl)-γ-aminopropyltrimethoxysilane, γ-glycidoxypropyltrimethoxysilane, β(3,4-epoxycyclohexyl)ethyltrimethoxysilane. Particularly preferred are aminosilanes as described above.

Preferred examples of titanium coupling agents are specifically, isopropyltriisostearoyl titanate, isopropyltridodecylbenzenesulfonyl titanate, isopropyltris(dioctylpyrophosphate)titanate, tetraisopropylbis(dioctylphosphate) titanate, tetraoctylbis(ditridecylphosphite) titanate, tetra(1,1-diallyloxymethyl-1-butyl)bis(ditridecyl)phosphite titanate, bis(dioctylpyrophosphate)oxyacetate titanate, bis(dioctylpyrophosphate)ethylene titanate, isopropyltrioctanoyl titanate, isopropyldimethacrylisostearoyl titanate, isopropylisostearoyldiacryl titanate, isopropyltri(dioctylphosphate)titanate, isopropyltricumylphenyl titanate, isopropyltri(N-amideethyl, aminoethyl) titanate, dicumylphenyloxyacetate titanate, and diisostearoylethylene titanate. Among them, preferred is isopropyltri(N-amideethyl, aminoethyl)titanate.

Surface treatment using these coupling agents can be carried out according to the conventional methods, without a particular limitation. More specifically, a sizing treatment in which the organic solvent solution or suspending solution of a coupling agent is applied as a sizing agent on the filler, drying and mixing with the use of Henschel mixer, a super mixer, or V-shape blender; the spray method, the integral blend method, or the dry concentrate method can be used appropriately depending on the form of fillers. Preferred are the sizing treatment, the dry mixing and the spray method.

With the above coupling agent, film-forming materials for glass can be used in combination. Said film-forming materials are not critical but include polyesters, urethane polymers, epoxy polymers, acryl polymers, isocyanate polymers, and vinyl acetate polymers.

In the present invention, the above surface-treated filler component can be blended. The proportion to be blended varies depending on the purposes and objects. In composition I, the surface-treated filler is blended in the proportion of 1 to 350 parts by weight, preferably 5 to 200 parts by weight based on 100 parts by weight of the above components (A) and (B). in composition II, the surface-treated filler is blended in the proportion of 1 to 350 parts by weight, preferably 5 to 200 parts by weight based on 100 parts by weight of the above components (A), (B) and (C).

If the proportion of the surface-treated filler to be blended is less than 1 part by weight, the sufficient effect of the blended filler cannot be obtained. On the other hand, if it exceeds 350 parts by weight, there occur defects that the dispersibility is poor and molding becomes difficult.

Further, in the present invention, by blending (A') a styrene polymer having a syndiotactic configuration as the above component (A), (B') either polyphenylene ether or a mixture of polyphenylene ether and a styrene polymer without any functional groups, having a maleic anhydride group, that is polyphenylene ether modified by maleic anhydride, as the component (B), and (D') a filler surface-treated by an amino silane coupling agent as the component (D) respectively, as described above, the adhesiveness between a styrene polymer and a filler can be improved and a resin composition having more excellent properties can be obtained.

The resin composition of the present invention comprises each component described above, but if necessary, various additives, other thermoplastic resins or rubber-like elastomers can be blended, so long as the object of the present invention is not hindered. Examples of the above additives are an antioxidant such as phosphite and phosphate described in Japanese Patent Application Laid-Open No. 284244/1988, an UV absorbent, an aliphatic carboxylate- or paraffin-based external lubricant as described in Japanese Patent Application Laid-Open Nos. 201350/1989 and 22587/1989, a nucleating agent such as an organic acid metal salt and an organic phosphorus compound, a releasing agent, an antistatic agent, a colorant, a flame retardant and a flame retardant aid.

The above thermoplastic resins include polyphenylene ether without any polar groups, polyolefin such as polyethylene, polypropylene, polybutene and polypentene, polyester such as polyethylene terephthalate, polybutylene terepthalate and polyethylene naphthalate, polythioether such as polyamide and polyphenylene sulfide, polycarbonate, polyarylate, polysulfone, polyether ether ketone, polyether sulfone, polyimide, polyamide imide, polymethyl methacrylate, an ethylene-acrylic acid copolymer, an acrylonitrile-styrene copolymer, an acrylonitrile-chlorinated polyethylene-styrene copolymer, an ethylene-vinyl acetate copolymer, an ethylene-vinyl alcohol copolymer, acrylonitrile-butadiene-styrene copolymer, a vinyl chloride resin, chlorinated polyethylene, fluorinated polyethylene, polyacetal, a thermoplastic polyurethane elastomer, 1,2-polybutadiene and styrene-maleic anhydride. The preferable thermoplastic resin is the one having affinity or reactivity with a polar group of polyphenylene ether having a polar group as Component (B). Examples are polyolefin such as polyethylene, polypropylene, polybutene and polypentene; polyphenylene sulfide; polyester such as polyethylene terephthalate, polybutylene terephthalate and polyethylene naphthalate; polycarbonate, polyarylate, polysulfone, polyether ether ketone, polyether sulfone, polyimide, polymethyl methacrylate, an ethyleneacrylate copolymer, an acrylonitrile-styrene copolymer, an acrylonitrile-chlorinated polyethylene-styrene copolymer, an ethylene-vinyl acetate copolymer, an ethylene-vinyl alcohol copolymer, an acrylonitrile-butadiene-styrene copolymer, polyacetal and a styrene-maleic anhydride copolymer, to which the compound having both a polar group and an unsaturated group, which is used for introduction of a polar group to polyphenylene ether having a polar group as Component (B), is introduced by melting reaction, solution reaction or polymerization. The most preferable thermoplastic resins include maleic anhydride-modified polyethylene, polypropylene, a styrene-maleic anhydride copolymer, polyarylate, polycarbonate, polyphenylene sulfide containing an epoxyl group and polyphenylene sulfide containing an amino group.

Various rubber-like elastomers can be used, and the most preferable one is a rubber-like copolymer containing a styrene-based compound as one component. Examples are styrene-butadiene copolymer rubber (SBR), a styrene-butadiene block copolymer (SB, SBS, BSB, etc.), a styrene-hydrogenated butadiene block copolymer (SEBS, SEB, etc.), a styrene-isoprene block copolymer (SI, SIS, ISI, etc.), a styrene-hydrogenated isoprene block copolymer (SEP, SEPS, etc.), or as described in Japanese Patent Application Laid-Open No. 292049/1989, a granular elastomer obtained by polymerizing a vinyl monomer in the presence of the polymer obtained by polymerizing one or at least two monomers selected from the group consisting of alkyl acrylate, alkyl methacrylate and a multi-functional monomer having a conjugated diene type double bond. Examples of the granular elastomer acrylonitrile-styrene grafted butadiene rubber (ABS), acrylonitrile-styrene grafted butadiene-butyl acrylate copolymer rubber (AABS), methyl methacrylate-styrene grafted butylacrylate rubber (MAS), styrene grafted butadiene rubber (SB), methyl methacrylate-styrene grafted butadiene rubber (MBS) and methyl methacrylate-styrene grafted butadiene-butyl acrylate copolymer rubber (MABS).

Further, examples are one or at least two block or graft copolymers selected from an A-B type block copolymer, an A-grafted B copolymer and a B-grafted A copolymer, wherein A is at least one styrene polymers or styrene copolymers selected from atactic polystyrene, acrylonitrile-styrene random copolymer, styrene-maleic anhydride random copolymer, styrene-acrylonitrile-anhydrous maleimide random copolymer, styrene-methyl methacrylate random copolymer and styrene-methacrylic acid random copolymer, and B is at least one polymers selected from polybutadiene, polyisoprene, hydrogenated polybutadiene, hydrogenated polyisoprene and polycarbonate, and at least one polymers selected from polyamide, polymethyl methacrylate, polyethylene terephthalate and polybutylene terephthalate.

Further, the rubber-like elastomers include, in addition to the above, natural rubber, polybutadiene, polyisoprene, polyisobutyrene, neoprene, ethylene-propylene copolymer rubber, polysulfide rubber, thiokol rubber, acrylic rubber, urethane rubber, silicone rubber and epichlorohydrin rubber.

The rubber-like elastomer modified by reacting with the compound having a polar group and an unsaturated group used for introduction of the polar group to polyphenylene ether having a polar group, may be used.

Among various flame retardants, particularly halogen-based flame retardants and phosphorus-based flame retardants are preferable. The halogen-based flame retardants include, for example, tetrabromobisphenol A, tetrabromophthalic anhydride, hexabromobenzene, tribromophenylallyl ether, pentabromotoluene, pentabromophenol, tribromophenyl-2,3-dibromo propyl ether, tris(2,3-dibromopropyl)phosphate, tris(2-chloro-3-bromopropyl) phosphate, octabromodiphenyl ether, decabromodiphenyl ether, octabromobiphenyl, pentachloropentacyclodecane, hexabromocyclododecane, hexachlorobenzene, pentachlorotoluene, hexabromobiphenyl, decabromobiphenyl, decabromobiphenyl oxide, tetrabromobutane, decabromodiphenyl ether, hexabromodiphenyl ether, ethylene-bis-tetrabromophthalimide), tetrachlorobisphenol A, tetrabromobisphenol A, an oligomer of tetrachlorobisphenol A or tetrabromobisphenol A, a halogenated polycarbonate oligomer such as a brominated polycarbonate oligomer, a halogenated epoxy compound, polychlorostyrene, halogenated polystyrene such as polytribromostyrene, poly(dibromophenylene oxide) and bis(tribromophenoxy)ethane.

The phosphorus-based flame retardants include ammonium phosphate, tricresyl phosphate, triethyl phosphate, acidic phosphate and triphenylphosphene oxide.

Among them, the preferable flame retardants are particularly polytribromostyrene, poly(dibromophenylene oxide), decabromodiphenyl ether, bis(tribromophenoxy)ethane, ethylene-bis-(tetrabromophthalimide), tetrabromobisphenol A and a brominated polycarbonate oligomer.

The above flame retardant is blended in the proportion of 3 to 40 parts by weight, preferably 5 to 35 parts by weight based on 100 parts by weight of the total amount of the above components (A) and (B) in Composition I of the present invention (based on 100 parts by weight of the total amount of the above components (A), (B) and (C) in Composition II). If the proportion of the flame retarder to be blended is less than 3 parts by weight, less effect is obtained. On the other hand, if it exceeds 40 parts by weight, flame retardance is not improved according to the amount added, but rather other mechanical properties are undesirably impaired.

And further, in the present invention, it is preferable to use a flame retardant aid with the above flame retardant. Various flame retardant aids can be used, for example, antimony flame retardant aids such as antimony trioxide, antimony pentaoxide, sodium antimonate, metal antimony, antimony trichloride, antimony pentachloride, antimony trisulfide and antimony pentasulfide. Also, in addition to the above, zinc borate, barium metaborate and zirconium oxide can be used. Among them, particularly antimony trioxide is preferable. Said flame retardant aid is blended in the proportion of 1 to 15 parts by weight, preferably 2 to 10 parts by weight based on 100 parts by weight of the total amount of the above components (A) and (B) in Composition I of the present invention (based on 100 parts by weight of the total amount of the above components (A), (B) and (C) in Composition II). If the proportion of the flame retardant aid to be blended is less than 1 part by weight, the effect as a flame retardant aid is insufficient. On the other hand, if it exceeds 15 part by weight, the effect as a flame retardant aid is not improved according to the amount added, but rather there exist possibility of impairing other properties undesirably.

Further, in the present invention, to prevent me dropping, a tetrafluoroethylene polymer can be used. Specific examples of the tetrafluoroethylene polymer are, i addition to the tetrafluoroethylene homopolyme (polytetrafluoroethylene), a copolymer of tetrafluoroethy ene and hexafluoropropylene, and further a tetrafluoroetl ylene copolymer containing a few copolymerizable ethy enically unsaturated monomers. The tetrafluoroethyler polymer containing 65 to 76% by weight, preferably 70 76% by weight of fluorine is used. The above tetrafluor ethylene polymer is blended in the proportion of 0.003 to 1 parts by weight, preferably 0.02 to 2 parts by weight base on 100 parts by weight of the total amount of the abov components (A) and (B) in Composition I of the present invention (based on 100 parts by weight of the total amount of the above components (A), (B) and (C) in Composition II).

As described above, the styrene polymer composition has excellent impact resistance, water resistance and mechanical property, and is expected to be utilized effectively for various purposes such as industrial materials including electric and electronic materials, industrial structural materials, automobile parts, domestic electric appliances and various machine parts.

The present invention is described in greater detail with reference to the following examples and comparative examples.

Reference Example 1

In a 500-milliliter glass reactor in which air had been replaced with argon, 17.8 g (71 mmol) of copper sulfate pentahydrate ($CuSO_4 \cdot 5H_2O$), 200 ml of toluene and 24 ml (250 mmol) of trimethylaluminum were placed and reacted at 40° C. for 8 hours. And then, from the solution obtained by removing the solid, the toluene was further distilled away under reduced pressure at room temperature to obtain 6.7 g of a contact product. The molecular weight of said product as determined by the freezing point depression method was 610.

Production Example 1

In a 2-liter reactor, 1 L (L=liter) of purified styrene, 7.5 mmol of the contact product obtained in the above Reference Example 1 as an aluminum atom, 7.5 mmol of triisobutyl aluminum and 0.038 mmol of pentamethylcyclopentadienyl titanium trimethoxide were placed and polymerized at 90° C. for 5 hours. After completion of the reaction, the resulting product was decomposed in a methanol solution of sodium hydroxide to remove the catalyst component, and then the residue was washed with methanol repeatedly and dried to obtain 466 g of a polymer.

The weight average molecular weight of said polymer as determined using 1,2,4-trichlorobenzene as a solvent at 130° C. by the gel permeation chromatography was 290,000. Weight average molecular weight/number average molecular weight was 2.72. The melting point and $^{13}$C-NMR measurements confirmed that said polymer was polystyrene having a syndiotactic configuration (SPS).

Production Example 2

In a 2-liter reactor, 1 L of purified styrene, 5 mmol as aluminum atom of the contact product obtained in the above Reference Example 1, 5 mmol of triisobutyl aluminum and 0.025 mmol of pentamethylcyclopentadienyl titanium trimethoxide were placed and polymerized at 90° C. for 5 hours. After completion of the reaction, the resulting product was decomposed in a methanol solution of sodium hydroxide to remove the catalyst component, and then the residue was washed with methanol repeatedly and dried to obtain 308 g of a polymer.

The weight average molecular weight of said polymer as determined using 1,2,4-trichlorobenzene as a solvent at 130° C. by the gel permeation chromatography was 389,000. Weight average molecular weight/number average molecular weight was 2.64. The melting point and $^{13}$C-NMR measurements confirmed that said polymer was polystyrene having a syndiotactic configuration.

Production Example 3

In a 2-liter reactor, 1 L of purified styrene, 7.5 mmol as aluminum atom of the contact product obtained in the above Reference Example 1, 7.5 mmol of triisobutyl aluminum and 0.038 mmol of pentamethylcyclopentadienyl titanium trimethoxide were placed and polymerized at 70° C. for 3 hours. After completion of the reaction, the resulting product was decomposed in a methanol solution of sodium hydroxide to remove the catalyst component, and then the residue was washed with methanol repeatedly and dried to obtain 580 g of a polymer.

The weight average molecular weight of said polymer as determined using 1,2,4-trichlorobenzene as a solvent at 130° C. by the gel permeation chromatography was 592,000. Weight average molecular weight/number average molecular weight was 2.81. The melting point and $^{13}$C-NMR measurements confirmed that said polymer was polystyrene having a syndiotactic configuration.

Production Example 4

With 100 parts by weight of poly(2,6-dimethyl-1,4-phenylene) ether (PPO)(catalogue No. 18178-1, produced by Aldorich Co.), 5 parts by weight of maleic anhydride (S Grade, produced by Wako Junyaku Co.) and 0.2 parts by weight of t-butylhydroxy peroxide (trade name: Perbutyl H, produced by Nippon Oil & Fats Co., Ltd.) as a peroxide were mixed by a Henschel mixer, and then the resulting mixture was kneaded by the twin-screw extruder at 300° to 320° C. under heat melting to obtain maleic anhydride-modified PPO. The resulting modified PPO was dissolved in toluene, and then the resulting mixture was reprecipitated dropwise with methanol to be purified. The purified modified PPO was molded by compression. The peak due to a carbonyl group was observed by an infrared ray measurement to confirm that the PPO was modified by maleic anhydride.

Production Example 5

With 100 parts by weight of styrene grafted polyphenylene ether (PPE)(trade name: Iupiace CPX 100, produced by Mitsubishi Gas Chemical Company Inc.) having an intrinsic viscosity of 0.45 at 25° C. in chloroform, 0.5 parts by weight of maleic anhydride (S Grade, produced by Wako Junyaku Co.) and 0.4 parts by weight of cumenehydro peroxide (trade name; Percumyl produced by Nippon Oil & Fats Co., Ltd.) as a peroxide were mixed by a Henschel mixer, and then the resulting mixture was kneaded by the twin-screw extruder at 300° C. under heat melting to obtain maleic anhydride-modified PPE. It was confirmed that the resulting modified PPE was modified by maleic anhydride in the same manner as in Production Example 4.

Production Example 6

With 85 parts by weight of poly(2,6-dimethyl-1,4-phenylene) ether (PPO)(catalogue No. 18178-1, produced by Aldorich Co.), 15 parts by weight of SPS obtained in Production Example 1, 0.5 parts by weight of maleic anhydride (S Grade, produced by Wako Junyaku Co.) and 0.2 parts by weight of t-butylhydroxy peroxide (trade name: Perbutyl H, produced by Nippon Oil & Fats Co., Ltd.) as a peroxide were mixed by a Henschel mixer, and then the resulting mixture was kneaded by the twin-screw extruder at 300° to 320° C. under heat melting to obtain maleic anhydride-modified PPO. It was confirmed that the resulting modified PPO was modified by maleic anhydride in the same manner as in Production Example 4.

Production Example 7

With 85 parts by weight of poly(2,6-dimethyl-1,4-phenylene) ether (PPO)(catlogue No. 18178-1, produced by Aldorich Co.), 15 parts by weight of Idemitsu Polystyrene HT-54 (HIPS), 5 parts by weight of maleic anhydride (S Grade, produced by Wako Junyaku Co.) and 0.2 parts by weight of t-butylhydroxy peroxide (trade name: Perbutyl H, produced by Nippon Oil & Fats Co., Ltd.) as a peroxide were mixed by a Henschel mixer, and then the resulting mixture was kneaded by the twin-screw extruder at 260° to 270° C. under heat melting to obtain maleic anhydride-modified PPO. It was confirmed that the resulting modified PPO was modified by maleic anhydride in the same manner as in Production Example 4.

EXAMPLE 1

To 100 parts by weight of the total amount of 75% by weight of polystyrene having a syndiotactic configuration (SPS) obtained in Production Example 1 and 25% by weight of maleic anhydride-modified PPO obtained in Production Example 4, 0.7 parts by weight of (2,6-di-t-butyl-4-methylphenyl) pentaerythritol diphosphite (trade name: PEP-36, produced by Adeka Argus Co., Ltd.), 0.1 parts by weight of 2,6-di-t-butyl-4-phenol (trade name: Sumilizer BHT, produced by Sumitomo Chemical Co., Ltd.) and 1 part by weight of p-(t-butyl)benzoic acid as an antioxidant were added. The resulting mixture was dry blended by a Henschel mixer, and then kneaded under melting by a twin-screw extruder having a cylinder temperature of 300° C. to be pelletized.

The resulting pellet was molded by injection to obtain test pieces for a bending test. The bending test was carried out. The results are shown in Table 1.

Comparative Example 1

To 100 parts by weight of polystyrene having a syndiotactic configuration (SPS) obtained in Production Example 1, 0.7 parts by weight of (2,6-di-t-butyl-4-methylphenyl) pentaerythritol diphosphite (trade name: PEP-36, produced by Adeka Argus Co., ltd.), 0.1 parts by weight of 2,6-di-t-butyl-4-phenol (trade name: Sumilizer BHT, produced by Sumitomo Chemical Co., Ltd.) and 1 part by weight of p-(t-butyl)benzoic acid as an antioxidant were added. The resulting mixture was dry blended by a Henschel mixer, and then kneaded under melting by a twin-screw extruder cylinder temperature of 300° C. to be pelletized.

The resulting pellet was molded by injection to obtain test pieces for a bending test. The bending test was carried out. The results are shown in Table 1.

TABLE 1

| No. | Bending Strength (kg/cm²) | Modulus of Bending Elasticity (kg/cm²) |
|---|---|---|
| Example 1 | 1300 | 49000 |
| Comparative Example 1 | 1000 | 39000 |

EXAMPLE 2

To 100 parts by weight of the total amount of 95% by weight of polystyrene having a syndiotactic configuration (SPS) obtained in Production Example 1 and 5% by weight of modified PPO obtained in Production Example 4, 0.7 parts by weight of (2,6-di-t-butyl-4-methylphenyl) pentaerythritol diphosphite (trade name: PEP-36, produced by Adeka Arugus Co., Ltd.), 0.1 parts by weight of 2,6-di-t-butyl-4-phenol (trade name: Sumilizer BHT, produced by Sumitomo Chemical Co., Ltd.) and 1 part by weight of p-(t-butyl)aluminum benzoate (trade name: PTBBA-Al, produced by Dainippon Ink Industry Co.) as an antioxidant were added. The resulting mixture was dry blended by a Henschel mixer, and then pelletized by a twin-screw extruder while side-feeding 43 parts by weight of glass fiber treated with amino silane (03T-488, 13 μm/3 mm, produced by Nippon Electric Glass Co., Ltd.) as a filler. The resulting pellet was molded by injection to obtain a bending test piece and an Izod impact test piece. Using the resulting test pieces, the bending test and Izod impact test were carried out. The heat distortion temperature was determined. The results are shown in Table 3.

EXAMPLES 3 TO 23 AND COMPARATIVE EXAMPLES 2 TO 6

The procedure of Example 2 was repeated except that SPS obtained in the above Production Examples 1 to 3, atactic polystyrene (trade name: Idemitsu Polystyrene HH30E, produced by Idemitsu Petrochemical Co., Ltd.) or high impac polystyrene (trade name: Idemitsu Polystyrene HT-54, produced by Idemitsu Petrochemical Co., Ltd.) was used as a styrene polymer, and the product obtained in the abovi Production Examples 4 to 7 or poly(2,6-dimethyl-1,4 phenylene)ether (catalogue No. 18178-1, produced b' Aldorich Co.) was used as polyphenylene ether, and furthe a filler and an additive were added according to the pre scription shown in Table 2.

These results are shown in Table 3.

However, in Example 12, with 100 parts by weight of th total amount of 95% by weight of syndiotactic polystyren (SPS) obtained in the above Production Example 1 and 5% by weight of poly(2,6-dimethyl-1,4-phenylene)ethe (catalogue No. 18178-1, produced by Aldorich Co.), 0. parts by weight of maleic anhydride (S Grade, produced b Hiroshima Wako Junyaku Co.) and 0.2 parts by weight c t-butyl-hydroxy peroxide (trade name: Perbutyl H, produce by Nippon Oil & Fats Co., Ltd.) as a peroxide were dr blended by a Henschel mixer, and then the resulting mixtur was pelletized by a twin-screw extruder while side-feedin 43 parts by weight of glass fiber treated with amino silar (03T-488, 13 μm/3 mm, produced by Nippon Electric Gla: Co., Ltd.) as a filler.

TABLE 2

| No. | Base Composition (100 Parts) Component (A) | wt % | Component (B) | wt % | Fibrous Filler | Filler Part by Weight | Granular Filler | Part by Weight |
|---|---|---|---|---|---|---|---|---|
| Example 2 | Product of Production Example 1 | 95 | Product of Production Example 4 | 5 | Chopped Strand*1 | 43 | — | — |
| Example 3 | Product of Production Example 1 | 97 | Product of Production Example 4 | 3 | Chopped Strand*1 | 43 | — | — |
| Example 4 | Product of Production Example 1 | 90 | Product of Production Example 4 | 10 | Chopped Strand*1 | 43 | — | — |
| Example 5 | Product of Production Example 1 | 70 | Product of Production Example 4 | 30 | Chopped Strand*1 | 43 | — | — |
| Comparative Example 2 | Product of Production Example 1 | 100 | — | — | Chopped Strand*1 | 43 | — | — |
| Comparative Example 3 | Product of Production Example 1 | 70 | PPO*2 | 30 | Chopped Strand*1 | 43 | — | — |
| Example 6 | Product of Production Example 1 | 90 | Product of Production Example 5 | 10 | Chopped Strand*1 | 43 | — | — |
| Example 7 | Product of Production Example 1 | 90 | Product of Production Example 6 | 10 | Chopped Strand*1 | 43 | — | — |
| Example 8 | Product of Production Example 2 | 92.5 | Product of Production Example 4 | 7.5 | Chopped Strand*1 | 65 | — | — |
| Example 9 | Product of Production Example 3 | 92.5 | Product of Production Example 4 | 7.5 | Chopped Strand*1 | 100 | — | — |
| Example 10 | Product of Production Example 1 | 92.5 | Product of Production Example 4 | 7.5 | Chopped Strand*1 | 115 | talc*6 | 70 |
| Example 11 | Product of Production Example 1 | 40 | Product of Production Example 4 | 60 | Chopped Strand*1 | 43 | — | — |
| Example 12 | Product of Production Example 1 | 95 | *7 | 5 | Chopped Strand*1 | 43 | — | — |
| Example 13 | aPS*8 | 95 | Product of Production Example 4 | 5 | Chopped Strand*1 | 43 | — | — |
| Example 14 | HIPS*9 | 95 | Product of Production Example 4 | 5 | Chopped Strand*1 | 43 | — | — |
| Example 15 | Product of Production Example 1 | 95 | Product of Production Example 7 | 5 | Chopped Strand*1 | 43 | — | — |
| Comparative Example 4 | Product of Production Example 1 | 15 | Product of Production Example 7 | 85 | Chopped Strand*1 | 43 | — | — |
| Comparative Example 5 | Product of Production Example 1 | 97 | PPO*2 | 3 | Chopped Strand*1 | 43 | — | — |
| Example 16 | Product of Production Example 1 | 95 | Product of Production Example 8 | 5 | Chopped Strand*1 | 43 | — | — |
| Example 17 | Product of Production Example 1 | 99 | Product of Production Example 9 | 1 | Chopped Strand*1 | 43 | — | — |
| Example 18 | Product of Production Example 1 | 97 | Product of Production Example 9 | 3 | Chopped Strand*1 | 43 | — | — |
| Example 19 | Product of Production Example 1 | 90 | Product of Production Example 9 | 10 | Chopped Strand*1 | 43 | — | — |
| Example 20 | Product of Production Example 1 | 97 | Product of Production Example 10 | 3 | Chopped Strand*1 | 43 | — | — |
| Example 21 | Product of Production Example 1 | 95 | Product of Production Example 11 | 5 | Chopped Strand*1 | 43 | — | — |
| Comparative Example 6 | Product of Production Example 1 | 90 | Product of Production Example 12 | 10 | Chopped Strand*1 | 43 | — | — |
| Example 22 | Product of Production Example 1 | 97 | Product of Production Example 4 | 3 | Chopped Strand*10 | 30 | — | — |
| Example 23 | Product of Production Example 1 | 97 | Product of Production Example 4 | 3 | Chopped Strand*10 | 40 | — | — |

| No. | Rubber-like Elastomer Kind | Part by Weight | Antioxidant (1) | Part by Weight | Antioxidant (2) | Part by Weight | Nucleating Agent Kind | Part by Weight |
|---|---|---|---|---|---|---|---|---|
| Example 2 | — | — | PEP-36 | 0.7 | BHT | 0.1 | PTBBA-Al | 1 |
| Example 3 | — | — | PEP-36 | 0.7 | BHT | 0.1 | PTBBA-Al | 1 |
| Example 4 | — | — | PEP-36 | 0.7 | BHT | 0.1 | PTBBA-Al | 1 |
| Example 5 | — | — | PEP-36 | 0.7 | BHT | 0.1 | PTBBA-Al | 1 |
| Comparative Example 2 | — | — | PEP-36 | 0.7 | BHT | 0.1 | PTBBA-Al | 1 |
| Comparative Example 3 | — | — | PEP-36 | 0.7 | BHT | 0.1 | PTBBA-Al | 1 |
| Example 6 | — | — | PEP-36 | 0.5 | MARK AO 60*3 | 0.1 | PTBBA-Al | 0.5 |
| Example 7 | — | — | P-EPQ*4 | 0.2 | MARK AO 60*3 | 0.1 | PTBBA-Al | 0.2 |
| Example 8 | SB*5 | 10 | P-EPQ*4 | 0.5 | MARK AO 60*3 | 0.1 | PTBBA-Al | 0.5 |
| Example 9 | — | — | PEP-36 | 0.5 | MARK AO 60*3 | 0.1 | PTBBA-Al | 0.5 |

TABLE 2-continued

| | | | | | | | | |
|---|---|---|---|---|---|---|---|---|
| Example 10 | — | — | PEP-36 | 0.5 | MARK AO 60*³ | 0.1 | PTBBA-A1 | 0.5 |
| Example 11 | — | — | PEP-36 | 0.5 | MARK AO 60*³ | 0.1 | PTBBA-A1 | 0.5 |
| Example 12 | — | — | PEP-36 | 0.7 | BHT | 0.1 | PTBBA-A1 | 0.5 |
| Example 13 | — | — | PEP-36 | 0.7 | BHT | 0.1 | PTBBA-A1 | 0.5 |
| Example 14 | — | — | PEP-36 | 0.7 | BHT | 0.1 | PTBBA-A1 | 0.5 |
| Example 15 | — | — | PEP-36 | 0.7 | BHT | 0.1 | PTBBA-A1 | 0.5 |
| Comparative Example 4 | — | — | PEP-36 | 0.7 | BHT | 0.1 | PTBBA-A1 | 0.5 |
| Comparative Example 5 | — | — | PEP-36 | 0.7 | BHT | 0.1 | PTBBA-A1 | 1 |
| Example 16 | — | — | PEP-36 | 0.7 | BHT | 0.1 | PTBBA-A1 | 1 |
| Example 17 | — | — | PEP-36 | 0.7 | BHT | 0.1 | PTBBA-A1 | 1 |
| Example 18 | — | — | PEP-36 | 0.7 | BHT | 0.1 | PTBBA-A1 | 1 |
| Example 19 | — | — | PEP-36 | 0.7 | BHT | 0.1 | PTBBA-A1 | 1 |
| Example 20 | — | — | PEP-36 | 0.7 | BHT | 0.1 | PTBBA-A1 | 1 |
| Example 21 | — | — | PEP-36 | 0.7 | BHT | 0.1 | PTBBA-A1 | 1 |
| Comparative Example 6 | — | — | PEP-36 | 0.7 | BHT | 0.1 | PTBBA-A1 | 1 |
| Example 22 | — | — | PEP-36 | 0.1 | BHT | 0.1 | PTBBA-A1 | 1 |
| Example 23 | — | — | PEP-36 | 0.1 | BHT | 0.1 | PTBBA-A1 | 1 |

*¹Chopped strand treated with aminosilane, 13 μm/3 mm, 03T-488; produced by Nippon Electric Glass Co., Ltd.
*²Poly(2,6-dimethyl-1,4 phenylene)ether
*³Tetrakis[methylene-3-(3',5'-di-t-butyl-4'-hydroxyphenyl)] propionate (produced by Adeka Argus Co., Ltd.)
*⁴Tetrakis(2,4-di-t-butylphenyl)-4-4'-biphenylene phosphite (produced by Ciba Geigy Co., Ltd.)
*⁵Styrene-butadiene rubber (ZLS-01, produced by Nippon Zeon Co.)
*⁶Talc treated by spraying a toluene/water suspension of γ-aminopropyl triethoxysilane.
*⁷Refer to the description of Example 12.
*⁸Atactic polystyrene (trade name: Polystyrene HH30E, produced by Idemitsu Petrochemical Co., Ltd.)
*⁹High impact polystyrene (trade name: Polystyrene HT-54, produced by Idemitsu Petrochemical Co., Ltd.)
*¹⁰Chopped strand treated with aminosilane and isocyanate, 14 μm/3 mm, 03T-051 produced by Nippon Electric Glass Co., Ltd.

TABLE 3

| No. | Bending Strength (kg/cm²) | Izod Impact Strength (notched) (kg · cm/cm) | Heat Distortion Temperature (18.6 kg/cm²) (°C.) |
|---|---|---|---|
| Example 2 | 1750 | 8.2 | 251 |
| Example 3 | 1650 | 7.6 | 252 |
| Example 4 | 1830 | 8.5 | 250 |
| Example 5 | 1860 | 8.7 | 220 |
| Comparative Example 2 | 1200 | 4.6 | 250 |
| Comparative Example 3 | 1480 | 5.0 | 215 |
| Example 6 | 1760 | 8.1 | 250 |
| Example 7 | 1780 | 8.3 | 251 |
| Example 8 | 1980 | 7.5 | 254 |
| Example 9 | 2150 | 8.0 | 260 |
| Example 10 | 2000 | 7.6 | 265 |
| Example 11 | 1850 | 8.8 | 190 |
| Example 12 | 1760 | 8.4 | 250 |
| Example 13 | 1740 | 8.0 | — |
| Example 14 | 1650 | 8.1 | — |
| Example 15 | 1790 | 8.3 | 252 |
| Comparative Example 4 | 1750 | 8.2 | 163*¹ |
| Comparative Example 5 | 1450 | 5.0 | 248 |
| Example 16 | 1610 | 6.7 | 252 |
| Example 17 | 1780 | 7.6 | 255 |
| Example 18 | 1810 | 8.8 | 254 |
| Example 19 | 1840 | 8.7 | 243 |
| Example 20 | 1770 | 8.5 | 250 |
| Example 21 | 1760 | 8.2 | 250 |
| Comparative Example 6 | 1400 | 4.9 | 250 |
| Example 22 | 1750 | 10.2 | 257 |
| Example 23 | 2070 | 9.5 | 260 |

*¹The resin of Comparative Example 4 was heat treated at 80° C. Its dimensional stability was good.

EXAMPLE 24

To 100 parts by weight of the total amount of 85% by weight of polystyrene having a syndiotactic configuration (SPS) obtained in Production Example 1, 5% by weight of maleic anhydride-modified PPO obtained in Production Example 4, and 10% by weight of nylon-6,6 (trade name: Ube Nylon 2020B, produced by Ube Kosan Co., Ltd.), 0.7 parts by weight of (2,6-di-t-butyl-4-methylphenyl) pentaerythritol diphosphite (trade name: PEP-36, produced by Adeka Argus Co., Ltd.), 0.1 parts by weight of 2,6-di-t-butyl-4-phenol (trade name: Sumilizer BHT, produced by Sumitomo Chemical Co., Ltd.) and 1 part by weight of p-(t-butyl)aluminum benzoate as an antioxidant were added. The resulting mixture was dry blended by a Henschel mixer and then kneaded under melting by twin-screw extruder at a cylinder temperature of 300° C. to be pelletized.

The resulting pellet was molded by injection to obtain tes pieces for a tensile test. The modulus of tensile elasticity, the water-absorptivity and the retention of the modulus o tensile elasticity after water-absorption were determined. The results are shown in Table 4.

EXAMPLES 25 TO 29 AND COMPARATIVE EXAMPLES 7 TO 9

The procedure of Example 24 was repeated except that styrene polymer, polyphenylene ether, polyamide and a additive were blended in the proportion shown in Table 4. The modulus of tensile elasticity, the water-absorptivity an the retention of the modulus of tensile elasticity after water absorption were determined. The results are shown in Tabl 4. In Example 24 Comparative Example 9, the blendin strength was determined.

EXAMPLE 30

To 100 parts by weight of the total amount of 85% b weight of polystyrene having a syndiotactic configuratio (SPS) obtained in Production Example 1, 5% by weight maleic anhydride-modified PPO obtained in Production Example 4, and 10% by weight of Nylon-6,6 (trade name: Ube Nylon 2020B, produced by Ube Kosan Co., Ltd.), 0.7 parts by weight of (2,6-di-t-butyl-4-methylphenyl) pentaerythritol diphosphite (trade name: PEP-36, produced by Adeka Argus Co., Ltd.), 0.1 parts by weight of tetrakis [methylene-3-(3',5'-di-t-butyl-4'-hydroxyphenyl)] propionate (trade name: MARK AO 60, produced by Adeka Argus Co., Ltd.) and 1 part by weight of p-(t-butyl)benzoic acid as an antioxidant were added. The resulting mixture was dry blended by a Henschel mixer, and then kneaded under melting by a twin-screw extruder at a cylinder temperature of 300° C. while side-feeding 43 parts by weight of glass fiber (trade name: CS03MA416, produced by Asahi Glass Fiber Co., Ltd.) treated with amino silane as a filler to be pelletized.

The resulting pellet was molded by injection to obtain test pieces for a tensile test and a bending test. The modulus of tensile elasticity, the water-absorptivity, the retention of the modulus of tensile elasticity after water-absorption and the heat distortion temperature were determined. The results are shown in Table 5.

In Example 34, 41, 42 and Comparative Example 10, the Izod impact strength was determined.

TABLE 4

| No. | Base Composition (100 parts) | | | | | |
|---|---|---|---|---|---|---|
| | Component (A) | wt % | Component (B) | wt % | Component (C) | wt % |
| Example 24 | Product of Production Example 1 | 85 | Product of Production Example 4 | 5 | Nylon-6,6 | 10 |
| Example 25 | Product of Production Example 1 | 85 | Product of Production Example 4 | 5 | Nylon-6*1 | 10 |
| Comparative Example 7 | Product of Production Example 1 | 90 | — | 0 | Nylon-6,6 | 10 |
| Comparative Example 8 | — | 0 | — | 0 | Nylon-6,6 | 100 |
| Example 26 | Product of Production Example 2 | 45 | Product of Production Example 5 | 10 | Nylon-6,6 | 45 |
| Comparative Example 9 | Product of Production Example 2 | 50 | — | 0 | Nylon-6,6 | 50 |
| Example 27 | Product of Production Example 2 | 15 | Product of Production Example 5 | 20 | Nylon-6,6 | 65 |
| Example 28 | Product of Production Example 2 | 15 | Product of Production Example 5 | 10 | Nylon-6,6 | 75 |
| Example 29 | Product of Production Example 2 | 40 | Product of Production Example 5 | 5 | Nylon-4,6*6 | 55 |

| No. | Antioxidant | | | | Nucleating Agent | |
|---|---|---|---|---|---|---|
| | Kind | Part by Weight | Kind | Part by Weight | Kind | Part by Weight |
| Example 24 | PEP-36 | 0.7 | BHT | 0.1 | PTBBA-A1*3 | 1 |
| Example 25 | PEP-36 | 0.7 | BHT | 0.1 | PTBBA-A1 | 1 |
| Comparative Example 7 | PEP-36 | 0.7 | BHT | 0.1 | PTBBA-A1 | 1 |
| Comparative Example 8 | PEP-36 | 0.7 | BHT | 0.1 | PTBBA-A1 | 1 |
| Example 26 | PEP-36 | 0.3 | AO-60*2 | 0.1 | PTBBA-A1 | 0.5 |
| Comparative Example 9 | PEP-36 | 0.3 | AO-60 | 0.1 | PTBBA-A1 | 0.5 |
| Example 27 | PEP-36 | 0.3 | AO-60 | 0.1 | PTBBA-A1 | 0.5 |
| Example 28 | PEP-36 | 0.3 | AO-60 | 0.1 | PTBBA-A1 | 0.5 |
| Example 29 | PEP-36 | 0.3 | AO-60 | 0.1 | PTBBA-A1 | 0.5 |

| No. | Modulus of Tensile Elasticity (kg/cm$^2$) | Water*4 Absorptivity (%) | Change in Modulus of Tensile Elasticity by Absorption*5 (%) | Bending Strength (kg/cm$^2$) |
|---|---|---|---|---|
| Example 24 | 49000 | 0.15 | 0 | — |
| Example 25 | 47000 | 0.15 | 0 | — |
| Comparative Example 7 | 36000 | 0.15 | 0 | — |
| Comparative Example 8 | 45000 | 1.30 | −10.5 | — |
| Example 26 | 48000 | 0.20 | 0 | 1200 |
| Comparative Example 9 | 41000 | 0.23 | 0 | 900 |
| Example 27 | 46000 | 0.52 | −4.9 | — |

TABLE 4-continued

| | | | | |
|---|---|---|---|---|
| Example 28 | 44000 | 0.90 | −8.5 | — |
| Example 29 | 48000 | 0.32 | −0.8 | 1500 |

*[1] Ube Nylon 1013B, produced by Ube Kosan Co., Ltd.

*[2] Tetrakis[methylene-3-(3',5'-di-t-butyl-4'-hydroxyphenyl)]propionate (produced by Adeka Argus Co., Ltd.)

*[3] P-(t-butyl)aluminum benzoate

*[4] Absorptivity (%) = $\dfrac{\text{Weight after Dipping} - \text{Weight before Dipping}}{\text{Weight before Dipping}} \times 100$

*[5] Change in Modulus of Tensile Elasticity (%) =

$\dfrac{\text{Modulus of Elasticity after Dipping} - \text{Modulus of Elasticity before Dipping}}{\text{Modulus of Elasticity befroe Dipping}} \times 100$

*[6] Unichika Nylon 46 (F5000), produced by Unichika Co., Ltd.

TABLE 5

| | Base Composition (100 parts) | | | | | | Filler | Part by |
|---|---|---|---|---|---|---|---|---|
| No. | Component (A) | wt % | Component (B) | wt % | Component (C) | wt % | Kind | Weight |
| Example 30 | Product of Production Example 3 | 90 | Product of Production Example 6 | 5 | Nylon-6,6 | 5 | Chopped*[1] Strand | 43 |
| Example 31 | Product of Production Example 3 | 80 | Product of Production Example 6 | 10 | Nylon-6,6 | 10 | Chopped Strand | 43 |
| Example 32 | Product of Production Example 3 | 60 | Product of Production Example 6 | 10 | Nylon-6,6 | 30 | Chopped Strand | 43 |
| Example 33 | Product of Production Example 3 | 25 | Product of Production Example 6 | 10 | Nylon-6,6 | 65 | Chopped Strand | 43 |
| Example 34 | Product of Production Example 3 | 45 | Product of Production Example 6 | 10 | Nylon-6,6 | 45 | Chopped Strand | 43 |
| Comparative Example 10 | Product of Production Example 3 | 50 | — | — | Nylon-6,6 | 50 | Chopped Strand | 43 |
| Example 35 | Product of Production Example 3 | 65 | Product of Production Example 6 | 20 | Nylon-6,6 | 15 | Chopped Strand | 43 |
| Example 36 | aPS*[3] | 80 | Product of Production Example 6 | 10 | Nylon-6,6 | 10 | Chopped Strand | 43 |
| Example 37 | HIPS*[4] | 80 | Product of Production Example 6 | 10 | Nylon-6,6 | 10 | Chopped Strand | 100 |
| Example 38 | Product of Production Example 1 | 80 | Product of Production Example 7 | 10 | Nylon-6,6 | 10 | Chopped Strand | 115 |
| Example 39 | Product of Production Example 1 | 80 | Product of Production Example 7 | 10 | Nylon-6,6 | 10 | Talc*[5] | 70 |
| Example 40 | Product of Production Example 1 | 80 | Product of Production Example 7 | 10 | Nylon-6 | 10 | Chopped Strand | 43 |
| Example 41 | Product of Production Example 1 | 47 | Product of Production Example 7 | 5 | Nylon-6,6 | 48 | Chopped Strand*[7] | 43 |
| Example 42 | Product of Production Example 2 | 40 | Product of Production Example 5 | 5 | Nylon-4,6 | 55 | Chopped Strand*[7] | 43 |

| | Rubber-like Elastomer | | Antioxidant | | | | Nucleating Agent | |
|---|---|---|---|---|---|---|---|---|
| No. | Kind | Part by Weight | Kind | Part by Weight | Kind | Part by Weight | Kind | Part by Weight |
| Example 30 | — | — | PEP-36 | 0.2 | AO-60 | 0.1 | PTBBA-A1*[2] | 0.5 |
| Example 31 | — | — | PEP-36 | 0.2 | AO-60 | 0.1 | PTBBA-A1 | 0.5 |
| Example 32 | — | — | PEP-36 | 0.2 | AO-60 | 0.1 | PTBBA-A1 | 0.5 |
| Example 33 | — | — | PEP-36 | 0.2 | AO-60 | 0.1 | PTBBA-A1 | 0.5 |
| Example 34 | — | — | PEP-36 | 0.2 | AO-60 | 0.1 | PTBBA-A1 | 0.5 |
| Comparative Example 10 | — | — | PEP-36 | 0.2 | AO-60 | 0.1 | PTBBA-A1 | 0.5 |
| Example 35 | — | — | PEP-36 | 0.2 | AO-60 | 0.1 | PTBBA-A1 | 0.5 |
| Example 36 | — | — | PEP-36 | 0.2 | AO-60 | 0.1 | PTBBA-A1 | 0.5 |
| Example 37 | — | — | PEP-36 | 0.2 | AO-60 | 0.1 | PTBBA-A1 | 0.5 |
| Example 38 | — | — | — | — | AO-60 | 0.1 | — | — |
| Example 39 | — | — | PEP-36 | 0.2 | AO-60 | 0.1 | — | — |
| Example 40 | SB*[6] | 10 | PEP-36 | 0.2 | AO-60 | 0.1 | PTBBA-A1 | 0.5 |
| Example 41 | — | — | PEP-36 | 0.1 | AO-60 | 0.1 | PTBBA-A1 | 1.0 |
| Example 42 | — | — | PEP-36 | 0.1 | AO-60 | 0.1 | PTBBA-A1 | 1.0 |

TABLE 5-continued

| No. | Modulus of Tensile Elasticity (kg/cm²) | Water Absorptivity (%) | Change in Modulus of Tensile Elasticity by Absorption (%) | Heat Distortion Temperature (18.6 kg/cm²) (°C.) | Izod Impact Strength (notched) (kg · cm/cm) |
|---|---|---|---|---|---|
| Example 30 | 93000 | 0.15 | 0 | 250 | — |
| Example 31 | 92500 | 0.14 | 0 | 250 | — |
| Example 32 | 89000 | 0.21 | 0 | 250 | — |
| Example 33 | 82000 | 0.51 | −5 | 250 | — |
| Example 34 | 84000 | 0.18 | 0 | 250 | 10.0 |
| Comparative Example 10 | 80000 | 0.19 | 0 | 245 | −5.1 |
| Example 35 | 88000 | 0.17 | 0 | 242 | — |
| Example 36 | 91000 | 0.16 | 0 | — | — |
| Example 37 | 86000 | 0.16 | 0 | — | — |
| Example 38 | 114000 | 0.21 | 0 | 260 | — |
| Example 39 | 125000 | 0.24 | 0 | 265 | — |
| Example 40 | 84000 | 0.16 | 0 | 243 | — |
| Example 41 | 103000 | 0.22 | 0 | 252 | 10.8 |
| Example 42 | 110000 | 0.24 | −1 | 270 | 10.3 |

*[1]Chopped strand glass fiber treated with amino silane, 13 μm/3 mm.
*[2]p-(t-butyl)aluminum benzoate
*[3]Atactic polystyrene (trade name: Polystyrene HH30E, produced by Idemitsu Petrochemical Co., Ltd.)
*[4]High impact polystyrene (trade name: Polystyrene HT-54, produced by Idemitsu Petrochemical Co., ltd.)
*[5]Styrene-butadiene rubber (ZLS-01, produced by Nippon Zeon Co.)
*[6]Talc treated by spraying a toluene/water suspension of γ-aminopropyl triethoxysilane.
*[7]Chopped strand treated with aminosilane and isocyanate, 14 μm/3 mm, 03T-051 produced by Nippon Electric Glass Co., Ltd.

What is claimed is:

1. A styrene polymer composition comprising:

(A) 99 to 75% by weight of a styrene polymer having a syndiotactic configuration, (B) 1 to 25% by weight of a polyphenylene ether modified by not less than 0.01% by weight of the polyphenylene ether of at least one compound selected from the group consisting of an unsaturated carboxylic acid, an unsaturated carboxylic acid derivative and an unsaturated epoxy compound, and (D) 1 to 200 parts by weight of a filler surface-treated with a coupling agent based on 100 parts by weight of the components (A) and (B).

2. The styrene polymer composition according to claim 1, wherein the component (B) is a fumaric acid modified polyphenylene ether.

3. The styrene polymer composition according to claim 1, wherein the component (B) is a fumaric acid modified poly(2,6-dimethyl-1,4-phenylene) ether.

4. The styrene polymer composition according to claim 3, wherein the component (D) is 1 to 200 parts by weight of glass fiber surface-treated with a silane coupling agent based on 100 parts by weight of the components (A) and (B).

5. The styrene polymer composition according to claim 1, wherein the component (B) is a glycidyl methacrylate modified polyphenylene ether.

6. The styrene polymer composition according to claim 1, wherein the component (B) is a glycidyl methacrylate modified poly(2,6-dimethyl-1,4-phenylene ether.

7. The styrene polymer composition according to claim 6, wherein the component (D) is 1 to 200 parts by weight of glass fiber surface-treated with a silane coupling agent based on 100 parts by weight of the components (A) and (B).

8. The styrene polymer composition according to claim 1, wherein the component (D) is 1 to 200 parts by weight of glass fiber surface-treated with a silane coupling agent based on 100 parts by weight of the components (A) and (B).

9. The styrene polymer composition according to claim 1, wherein the filler is selected from the group consisting of glass fiber and talc.

10. The styrene polymer composition according to claim 1, wherein the coupling agent is a silane coupling agent.

11. The styrene polymer composition according to claim 1, wherein the styrene polymer is selected from the group consisting of polystyrene, poly(vinyl benzoate), poly(methylstyrene), poly(ethylstyrene), poly(isopropylstyrene), poly(tert-butylstyrene), poly(phenylstyrene), poly(vinylnaphthalene), poly(vinylstyrene), poly(chlorostyrene), poly(bromostyrene) and (poly(fluorostyrene); the styrene polymer having a syndiotacticity such that the proportion of racemic pentad is at least 50%; and the styrene polymer having a weight average molecular weight of at least 50,000.

12. The styrene polymer composition according to claim 11, wherein the polyphenylene ether is selected from the group consisting of poly(2,3-dimethyl-6-ethylphenylene-1,4-ether),
poly(2-methyl-6-chloromethyl-1,4-phenylene)ether,
poly(2-methyl-6-hydroxydiethyl-1,4-phenylene)ether,
poly(2-methyl-6-n-butyl-1,4-phenylene)ether,
poly(2-ethyl-6-isopropyl-1,4-phenylene)ether,
poly(2-ethyl-6-n-propyl-1,4-phenylene)ether,
poly(2,3,6-trimethylphenylene-1,4-ether),
poly|2-(4'-methylphenyl)phenylene-1,4-ether|,
poly(2-bromo-6-phenylphenylene-1,4-ether),
poly(2-methyl-6-phenylphenylene-1,4-ether),
poly(2-phenylphenylene-1,4-ether),
poly(2-chlorophenylene-1,4-ether),
poly(2-methylphenylene-1,4-ether),
poly(2-chloro-6-ethylphenylene-1,4-ether),
poly(2-chloro-6-bromophenylene-1,4-ether),
poly(2-6-di-n-propylphenylene-1,4-ether),
poly(2-methyl-6-isopropylphenylene-1,4-ether),
poly(2-chloro-6-methylphenylene-1,4-ether),
poly(2-methyl-6-ethylphenylene-1,4-ether),
poly(2,6-dibromophenylene-1,4-ether), poly(2,6-dichlorophenylene-1,4-ether),
poly(2,6-diethylphenylene-1,4-ether), and
poly(2,6-dimethylphenylene-1,4-ether).

13. The styrene polymer composition according to claim 1, wherein the component (B) is a maleic anhydride modified polyphenylene ether.

14. The styrene polymer composition according to claim 1, wherein the component (B) is a maleic anhydride modified poly (2,6-dimethyl-1,4-phenylene) ether.

15. The styrene polymer composition according to claim 14, wherein the component (D) is 1 to 200 parts by weight of glass fiber surface-treated with a silane coupling agent based on 100 parts by weight of the components (A) and (B).

16. The styrene polymer composition according to claim 1, which further comprises (E) 0.1 to 2 parts by weight of a nucleating agent based on 100 parts by weight of the total of said components (A) and (B).

17. The styrene polymer composition according to claim 16, wherein the nucleating agent is selected from the group consisting of an organic acid metal salt and an organic phosphorus compound.

18. The styrene polymer composition according to claim 17, wherein the nucleating agent is present in an amount of 0.2 to 1 parts by weight based on 100 parts by weight of the total of said (A) and said (B).

19. The styrene polymer composition according to claim 18, wherein the nucleating agent is p-(t-butyl)aluminum benzoate.

* * * * *